(12) United States Patent
Morita (10) Patent No.: US 11,595,040 B2
(45) Date of Patent: Feb. 28, 2023

(54) AIR CONDITIONING CONTROLLER FOR CONTROLLING AN AIR CONDITIONER

(71) Applicant: DENSO WAVE INCORPORATED, Aichi-pref. (JP)

(72) Inventor: Yuya Morita, Chita-gun (JP)

(73) Assignee: DENSO WAVE INCORPORATED, Aichi-pref. (JP)

(*) Notice: Subject to any disclaimer, the term of this patent is extended or adjusted under 35 U.S.C. 154(b) by 26 days.

(21) Appl. No.: 17/115,980

(22) Filed: Dec. 9, 2020

(65) Prior Publication Data
US 2021/0184672 A1 Jun. 17, 2021

(30) Foreign Application Priority Data

Dec. 12, 2019 (JP) .............................. JP2019-224300

(51) Int. Cl.
*F25B 49/02* (2006.01)
*H03K 17/687* (2006.01)

(52) U.S. Cl.
CPC ......... *H03K 17/6872* (2013.01); *F25B 49/02* (2013.01)

(58) Field of Classification Search
CPC .............................. H03K 17/6872; F25B 49/02
See application file for complete search history.

(56) References Cited

U.S. PATENT DOCUMENTS

2016/0361641 A1* 12/2016 Koizumi ................ G08C 19/00

FOREIGN PATENT DOCUMENTS

| JP | 2016-090072 A | | 5/2016 |
|---|---|---|---|
| JP | 2016090072 A | * | 5/2016 |

OTHER PUBLICATIONS

Awano, Remote Control Device, 2016, Full Document (Year: 2016).*

* cited by examiner

*Primary Examiner* — Nael N Babaa
(74) *Attorney, Agent, or Firm* — Oliff PLC

(57) ABSTRACT

An air conditioning controller for controlling an air conditioner by an operation of an operator. The air conditioning controller is convenience to the operator to carry. The air conditioning controller includes a controller unit having an operating part by which the operator operates the air conditioner, a holder holding the controller unit at a predetermined position, and an electrical switch for switching an electrical power supply line between a first position that the controller unit positions outside of the holder and that the electric power from an internal battery is supplied to a controlling part of the controller unit and a second position that the controller unit positions in the holder and that the electric power from an electrical power source is supplied to the controlling part of the controller unit.

11 Claims, 7 Drawing Sheets

AIR CONDITIONING CONTROLLER FOR CONTROLLING AN AIR CONDITIONER

CROSS-REFERENCE TO RELATED APPLICATION

This application is based on and claims the benefit of priority from earlier Japanese Patent Application No. 2019-224300 filed Dec. 12, 2019, the description of which is incorporated herein by reference.

BACKGROUND

1. Technical Field

The present disclosure relates to an air conditioner and an air conditioning controller for controlling the air conditioner.

2. Related Art

The air conditioner has an air conditioning unit and an air conditioning controller for controlling the air conditioning unit. The air controlling controller is portable so that an operator may bring the air conditioning controller. Such portable air conditioning controller is described in Japanese laid open patent publication 2016-90072.

As such portable air conditioning controller uses battery, the operator shall frequently change the battery when the capacity of the battery is small. On the other hand, the weight of the air controlling controller shall become heavier when the capacity of the battery is large.

SUMMARY

The object of the present disclosure is to provide the air conditioning controller which is convenience for the operator to carry.

A first disclosure relates to an air conditioning controller 12 for controlling an air conditioner 11 by an operation of an operator. The air conditioning controller 12 comprises a controller unit 20 having an operating part such as a touch panel 55 by which the operator operates the air conditioner 11, a holder 30 holding the controller unit 20 at a predetermined position, and an electrical switch for switching an electrical power supply line between 61 a first position that the controller unit 20 positions outside of the holder 30 and that an electric power from an internal battery 65 is supplied to a controlling part such as a CPU 51 of the controller unit 20 and a second position that the controller unit 20 positions in the holder 30 and that the electric power from an electrical power source 45 is supplied to the controlling part of the controller unit 20.

The air conditioning controller 12 may be held in the holder 30 and could be carried out from the holder 30 so that the operator could bring the portable air conditioning controller 12. As the electrical switch switches the electrical power supply line between the first position and the second position, and as the electric power from the electrical power source 45 is supplied to the controlling part of the controller unit 20, the frequency for changing the internal battery 65 or charging the internal battery 65 could become small even the capacity of the internal battery 65 is small.

The air conditioning controller of the second disclosure switches from the second position to the first position when the controller unit is moved from the holder and the electric power from the electrical power source is not supplied. As the electrical switch automatically switches from the second position to the first position when the controller unit is moved from the holder, the operator does not have to do the additional switching operation.

The air conditioning controller of the third disclosure switches from the first position to the second position when the controller unit is moved in the holder and the electric power from the electrical power source is supplied. As the electrical switch automatically switches from the first position to the second position when the controller unit is moved in the holder, the operator does not have to do the additional switching operation.

As to the fourth disclosure, the holder has a holder side connector 35 connecting with the electric power source and the controller unit has a controller unit side connecter 25 which is connectable to the holder side connecter 35. Since the holder side connecter 35 contacts with the controller unit side connecter 25 when the controller unit is positioned in the holder and the holder side connecter 35 disconnects with the controller side connecter 25 when the controller unit positions outside of the holder, the operator does not have to do the additional switching operation.

As to the fifth disclosure, the electrical switch 67 locates in the electrical power supply line 61 between the internal battery 65 and the controlling part. The electrical switch 67 switches between the first position where the electric power from the electrical power source 45 is not supplied to the controller unit 20 and the electrical power supply line 61 is connected with the internal battery 65 and the second position where the electric power from the electrical power source 45 is supplied to the controller unit 20 and the electrical power supply line is disconnected with the internal battery 65.

As the electrical switch automatically switches the first position and the second position in accordance with the supply from the electrical power source 45, the operator does not have to do the additional switching operation.

The fifth disclosure may be modified as follows. The electrical switch 67 locates in the electrical power supply line between the internal battery 65 and the controlling part. The electrical switch 67 switches between the first position where the electric power from the electrical power source 45 is not supplied to the controller unit and the electrical power supply line is connected with the internal battery 65 and the second position where the electric power from the electrical power source 45 is supplied to the controller unit and the electrical power supply line is disconnected with the internal battery 65. The electrical switch switches between the first position where the controller unit locates outside from the holder 30 and the second position where the controller unit locates in the holder 30.

According to the fifth disclosure to the eleventh disclosure, the first position is a position where the electric power from the electrical power source 45 is not supplied to the controller unit 20 and the electrical power supply line is connected with the internal battery 65 and also is a position where the controller unit 20 locates outside from the holder 30. The second position of the fifth disclosure to the eleventh disclosure is a position where the electric power from the electrical power source 45 is supplied to the controller unit 20 and the electrical power supply line is disconnected with the internal battery 65 and also is a position where the controller unit 20 locates in the holder 30.

As to the sixth disclosure, the electrical switch has a P type MOSFET switch 67 a source of which is connected with the internal battery 65, a drain of which is connected with the controlling part and a gate of which is connected with the electrical power source 45 when the electric power of the electrical power source is supplied. The electrical switch 67 switches between the first position the electric power from the electrical power source is not supplied and the electric voltage difference between the source and the gate is more than a predetermined threshold level voltage and the second position the electric power from the electrical power source 45 is supplied and the electric voltage difference between the source and the gate is smaller than the predetermined threshold level voltage.

As the electrical switch of the sixth disclosure has a P type MOSFET switch 67, the switching operation relying on the electrical power source 45 could be effectively achieved.

As to the seventh disclosure, the electric voltage of the internal battery 65 is lower than the electric voltage of the electrical power source 45. The electrical switch has a regulator 64 so regulating the voltage applying to the gate that the electric voltage difference between the gate and the source is lower than the predetermined threshold level voltage when the electric power source 45 supplies the electric power to the controller unit 20.

In the case the electrical switch has the P type MOSFET such 67 as the sixth disclosure, the regulator 64 is preferred to position between the electrical power source 45 and the gate, so that the regulator 64 may reduce the electric voltage lower than the predetermined voltage.

As at the eighth disclosure, the electrical switch has a P type MOSFET first switch 67 and a N type MOSFET second switch 68. A source of the first switch 67 is connected with the internal battery 65, a drain of the first switch is connected with the controlling part, and a gate of the first switch is connected with the internal battery 65 via the second switch 68.

The first switch switches between the first position where the electric voltage difference between the source and the gate of the first switch 67 is higher than a first predetermined threshold level voltage and the second position where the electric voltage difference between the source and the gate of the first switch 67 is lower than the first predetermined threshold level voltage.

The second switch 68 switches between a third position where the electric voltage applying from the internal battery 65 to the gate of the first switch 67 is so regulated that the electric voltage difference between the source and the gate of the first switch 67 is lower than the first predetermined threshold level voltage when the electric power is supplied from the electrical power source 45 to the controller unit 20 and a fourth position where the electric voltage from the internal battery 65 is not supplied to the gate of the first switch 67 so that the electric voltage difference between the source and the gate of the first switch is higher than the first predetermined threshold level voltage when the electric power is not supplied from the electrical power source 45 to the controller unit 20.

Since the electric power from the internal battery 65 is applied to both source and gate of the first switch 67, the voltage different between the source and gate due to the charging condition of the internal battery 65 is effectively avoided. Namely, since the second switch 68 is controlled by the electric power of the electrical power source 45 and since the electric voltage of the gate of the first switch 67 is controlled by the second switch 68, the influence of the condition of the internal battery 65 could be minimized. Accordingly, the liability of the switching operation of the electrical power supply line could be increased.

As to the ninth disclosure, a gate of the second switch 68 is connected to the electrical power source 45 when the electrical power source 45 supplies the electric power to the controller unit 20, a drain of the second switch 68 is connected with the internal battery 65, and a source of the second switch 68 is connected with the gate of the first switch 67. The second switch 68 switches between the third position where the electric voltage difference between the source and the gate of the second switch 68 is higher than a second predetermined threshold level voltage when the electric power is supplied from the electrical power source 45 to the controller unit 20 so that the electric power from the internal battery 65 is applied to the gate of the first switch 67 and that the first switch 67 turns to the second position and the fourth position where the electric voltage difference between the source and the gate of the second switch 68 is lower than the second predetermined threshold level voltage when the electric power is not supplied from the electrical power source 45 to the controller unit 20 so that the electric power from the internal battery 65 is not applied to the gate of the first switch 67 and that the first switch 67 turns to the first position.

Since the gate of the first switch 67 is connected with the source of the second switch 68, since the first switch 67 is the P type MOSFET and the second switch 68 is the N type MOSFET, since the second switch 68 switches the third position and the fourth position due to the electric power of the electrical power source 45, and since the substantially high electric voltage could be applied to the gate compare to the source of the N type MOSFET, the liability of the switching operation of the electrical power supply line could be increased.

As to the tenth disclosure, the electric voltage applied to the gate of the second switch 68 is varied between the third position and the fourth position. The electric voltage difference between the gate and the source of the second switch is higher than the second predetermined threshold level voltage on both positions of the third position and the fourth position.

As the electric power applied to the gate of the first switch 67 from the internal battery 65 is maintained though the second switch 68 switched from the fourth condition to the third condition, the leak of the electric current from the internal battery 65 is effectively limited.

The eleventh disclosure relates to an air conditioning controller 12 for controlling an air conditioner 11 by an operation of an operator. The air conditioning controller has a controller unit 20 having an operating part such as a touch panel 55 by which the operator operates the air conditioner 11 and a controlling part such as a CPU 51 outputting a commanding order provided by the operating part to the air conditioner 11. The air conditioning controller 12 also has an electrical switch for switching an electrical power supply line between a first position that the electric power from an internal battery 65 is supplied to the controlling part of the controller unit 20 and a second position that the electric power from an electrical power source 45 is supplied to the controlling part of the controller unit 20.

As to the eleventh disclosure, the electrical switch has a P type MOSFET first switch 67 located between the internal battery 65 and the controlling part a drain of which is connected with the internal battery and a drain of which is connected with the controlling part and a N type MOSFET second switch 68 a source of which is connected with a gate of the first switch 67, a drain of which is connected with the internal battery 65 and a gate of which is connected with the electrical power source 45 when the electrical power source supplies the electric power to the controller unit 20.

The first switch 67 switches between a permitting position where the electric flow between the source and the drain of the first switch is permitted when the electric voltage difference between the source and the gate of the first switch 67 is higher than a first predetermined threshold level voltage and a limiting position where the electric flow between the source and the drain of the first switch 67 is limited when the electric voltage difference between the source and the gate of the first switch 67 is lower than the first predetermined threshold level voltage.

The second switch 68 switches between a permitting position where the electric flow between the source and the drain of the second switch 68 is permitted when the electric voltage difference between the source and the gate of the second switch 68 is higher than a second predetermined threshold level voltage and a limiting position where the electric flow between the source and the drain of the second switch 68 is limited when the electric voltage difference between the source and the gate of the first switch 67 is lower than the second predetermined threshold level voltage.

The first switch 67 turns to the limiting position where the electric power from the internal battery 65 is applied to the gate of the first switch when the second switch 68 turns to the permitting position where the electric power from the electrical power source 45 is applied to the gate of the second switch 68 when the electrical power source 45 supplies the electric power to the controller unit 20 and turns to the permitting position where the electric power from the internal battery 65 is not applied to the gate of the first switch 67 when the second switch 68 turns to the limiting position where the electric power from the electrical power source is not applied to the gate of the second switch 68 when the electrical power source 45 does not supply the electric power to the controller unit 20.

Since the electric voltage from the internal battery is applied both the source and the gate of the first switch 67, the voltage difference between the source and the gate of the first switch due to the condition of the internal battery is effectively avoided. Accordingly, the controller unit 20 could keep its liability even the electric voltage of the internal battery 65 is varied due to the atmosphere temperature and/or capacity of the internal battery 65.

Since the gate of the first switch 67 is connected with the source of the second switch 68, since the first switch 67 is the P type MOSFET and the second switch 68 is the N type MOSFET, and since the substantially high electric voltage could be applied to the gate compare to the source of the N type MOSFET, the liability of the switching operation of the electrical power supply line could be increased.

The air conditioner of the twelfth disclosure has the air conditioning controller 12 and an air conditioning unit 11 operated by a commanding order from the air conditioning controller. The twelfth disclosure relates to the air conditioner having the effects described above.

BRIEF DESCRIPTION OF THE DRAWINGS

FIG. 6(b) shows the electrical power supply line while the first switch is on.
FIG. 8(b) shows the electrical power supply line while the first switch is on.

DETAILED DESCRIPTION OF THE PREFERRED EMBODIMENTS

First Embodiment

The present disclosure is explained hereinafter relating to an air conditioner used in the building and/or housing.

Figure 1:
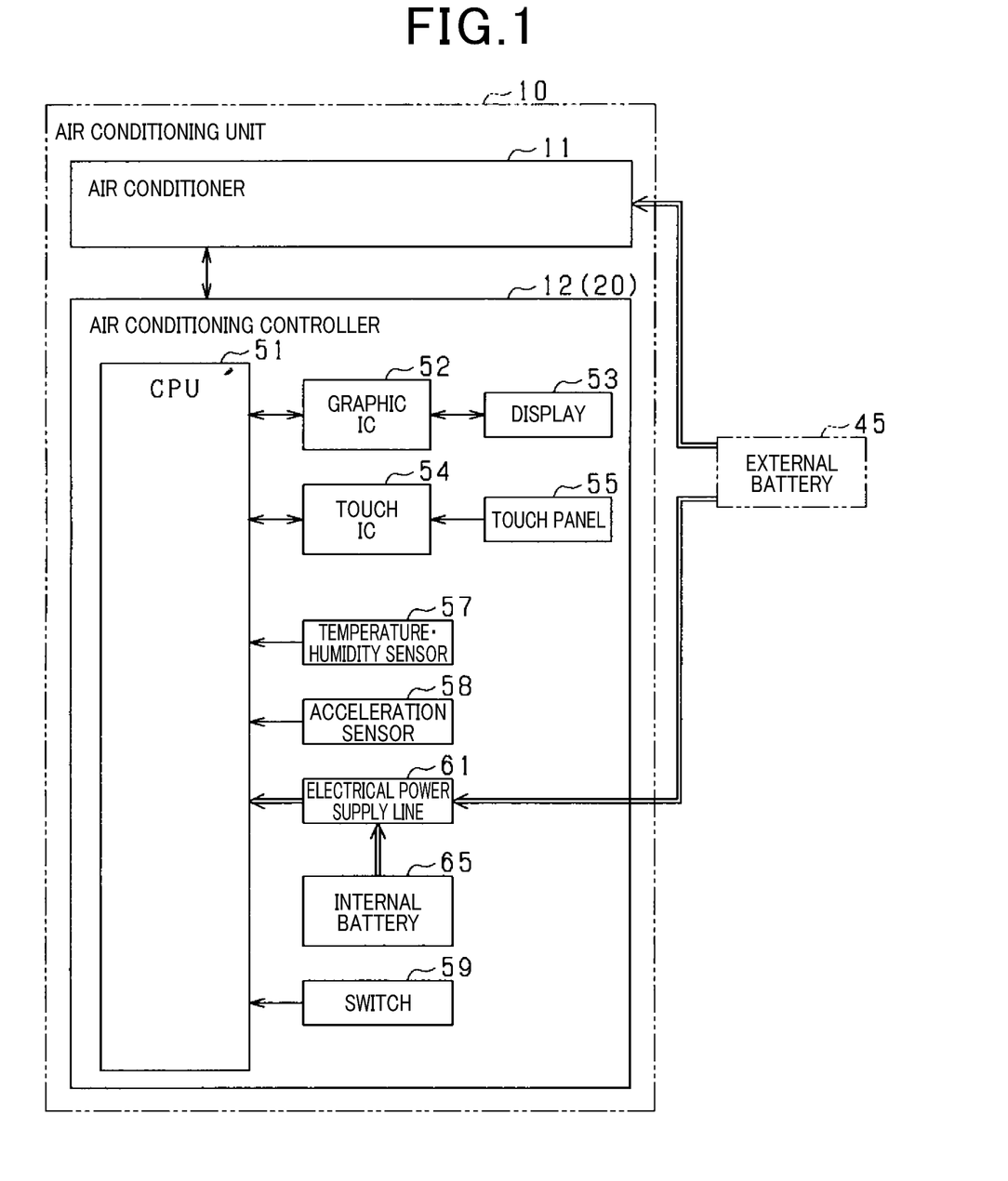
FIG. 1 is a block diagram of an air conditioner.

As shown in FIG. 1, the air conditioner 10 has an air conditioning unit 11 and an air conditioning controller 12 which is connected with the air conditioning unit 11 by radio frequency. The air conditioning controller 12 controls an operation of the air conditioning unit 11 including an air conditioning mode (cool, heat, dehumidification, fan), a target temperature, an air volume, and a direction of the wind. When an operator decides a commanding order, such order is sent to the air conditioning unit 11 and the receiving air conditioning unit 11 follows the commanding order.

The air conditioning controller 12 has a controller unit 20 as a portable apparatus the detailed of which is explained later. The controller unit 20 has a CPU 51 which mainly controls the operation. A display 53 is connected with the CPU 51 via graphic IC 52 so that the graphic IC 52 controls the image displayed on the display 53 in accordance with the commanding order from the CPU 51. An electrostatic capacitance type touch panel 55 is connected with the CPU 51 via a touch IC 54. The touch panel 55 is so accumulated with the display 53 that the touch panel 55 locates on the front face of the display 53 and that the operator could visibly recognize the image displayed on the display 53

The touch IC 54 detects the change of the electrostatic capacitance of the touch panel 55 where the operator touches and sends the touching information to the CPU 51. The CPU 51 decides whether or not the touching information exists and the location where the operator touches. Accordingly, the CPU 51 words as the "controlling part" and the touch panel 55 works as the "detecting part".

The controller unit 20 also has a thermometer/humidity sensor 57 detecting the room temperature and humidity and an acceleration sensor 58 detecting the movement of the air conditioning controller 12. Both the thermometer/humidity sensor 57 and the acceleration sensor 58 are connected to the CPU 51 so that the detected information from sensor 57 and 58 is transferred to the CPU 51. The room temperature and/or the humidity is displayed on the display 53 in accordance with the commanding order from the CPU 51. The CPU 51 has the reset function for resetting the touch IC 54 in accordance with the detected information from the acceleration sensor 58.

Figure 3A:
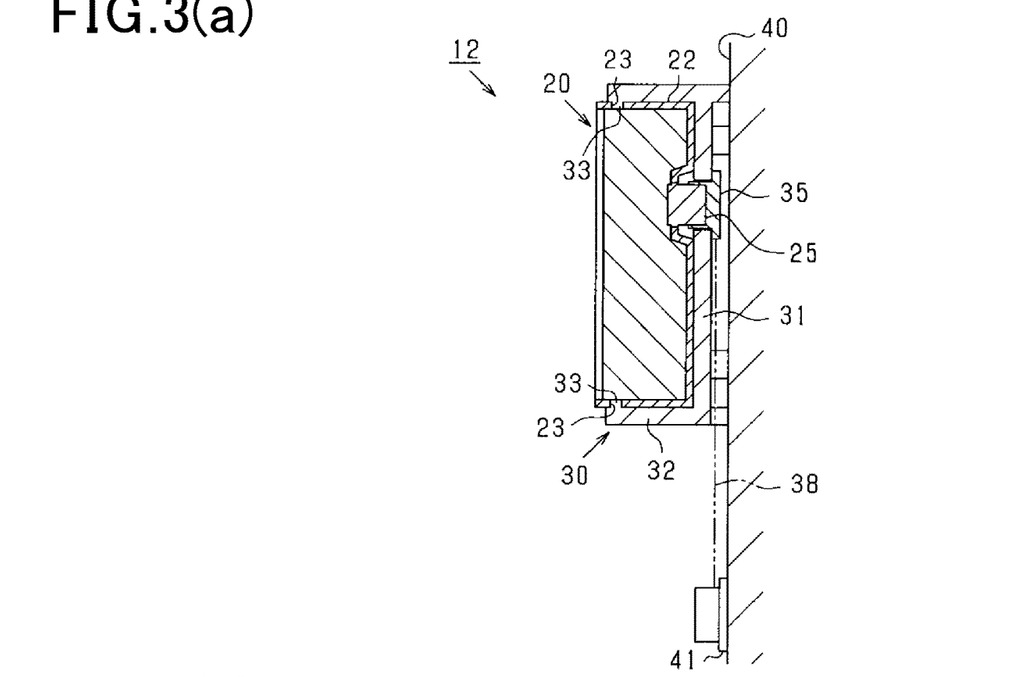
FIG. 3(a) is a sectional view of the air conditioning controller positioned in a holder.
Figure 3B:
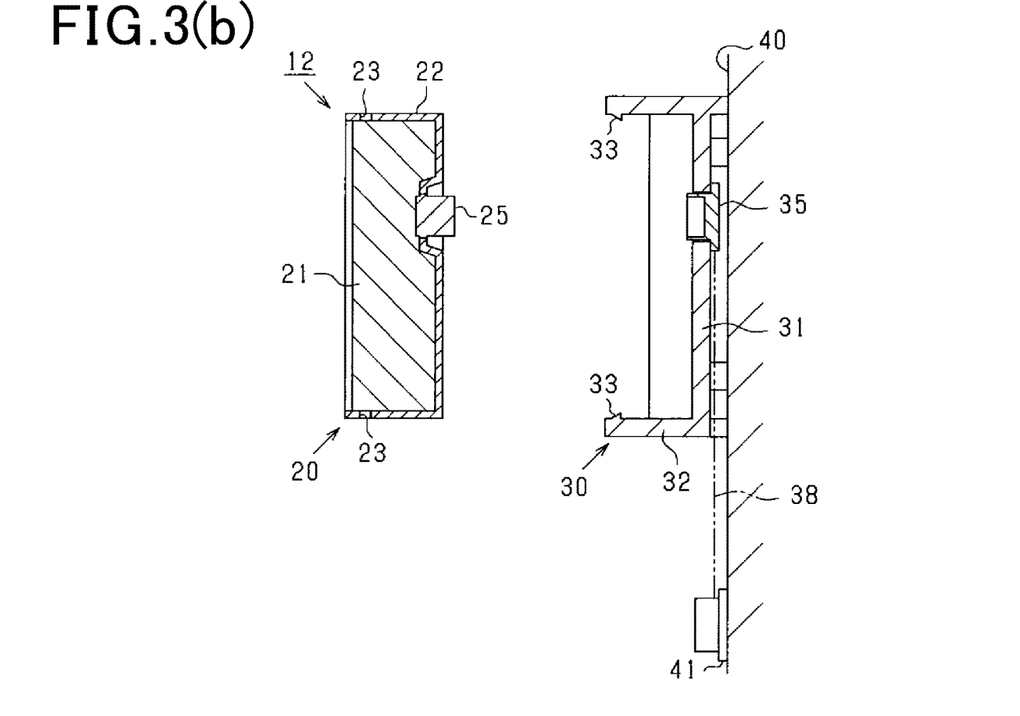
FIG. 3(b) is a sectional view of the air conditioning controller positioned outside of the holder.

The controller unit 20 is connected with the electric power source 45 via an electric cable line 38 (shown in FIG. 3) so that 24V of electric voltage from the electric power source 45 is supplied to the CPU 51, the graphic IC 52 and the touch IC 54 via an electrical power supply line 61 positioned in the air conditioning controller 12. The controller unit 20 also has a power switch 59 by which the operator turns the controller unit 20 on and off.

The controller unit has an internal battery 65 such as a couple of AA cell batteries in series configuration (3V of electric voltage). The electric power from the internal battery 65 is supplied to the CPU 51, the graphic IC 52 and the touch IC 54 via the electrical power supply line 61 in the case when the electric power from the electric power source 45 is not supplied.

Figure 2:
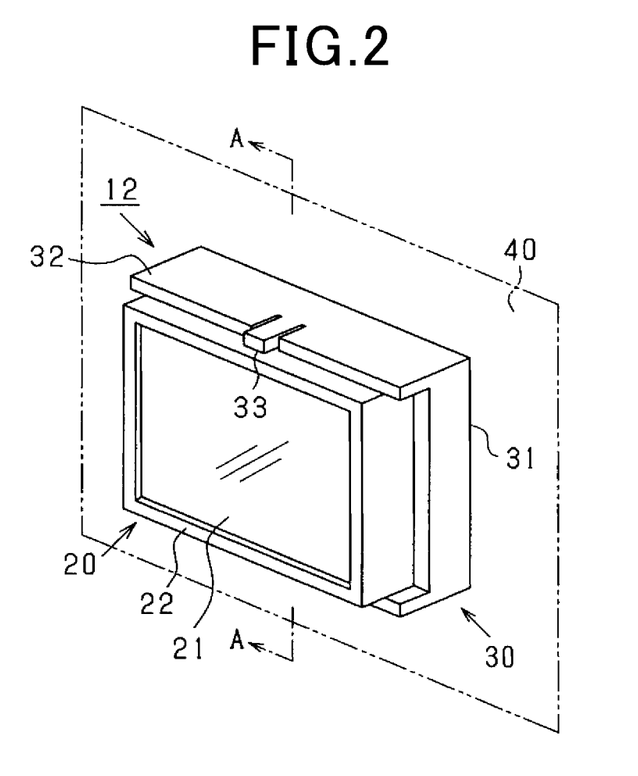
FIG. 2 is a perspective view of an air conditioning controller.

As shown in FIG. 2, the air conditioning controller 12 has a holder 30 which is able to hold the controller unit 20. As shown in FIGS. 3(a) and 3(b), the holder 30 has a flat base portion 31 fixed on the surface of the wall of the room and a holding portion 32 positioned perpendicular to the base portion 31 so that the holder 30 is a box shape surrounding the controller unit 20. In the case when the controller unit 20 is held in the holder 30 (holding position) the rear surface (right side of FIG. 3(a)) of the controller unit 20 contacts to the front surface (left side of FIG. 3(a)) of the base portion 31.

The controller unit 20 is formed by a controller main part 21 and a case unit 22 holding the controller main part 21 in such a manner that the operating surface (displaying surface) of the controller main part 21 is not covered. A notch portion 33 is formed the inner surface of the holding portion 32 of the holder 30 so that the notch portion 33 contacts with a concave portion 23 formed in the case unit 22 when the controller unit 20 is held at the holding position. As the holding portion 32 is flexible, the operator may remove the controller unit 20 from the holder 30 by so deforming the holding portion 32 that the notch portion 33 is disengaged from the concave portion 23.

A holder side connector 35 is fixed on the base portion 31 of the holder 30. The holder side connector 35 is connected with the electric power source 45 via the electric cable line 38. A controller unit side connector 25 is formed on the rear surface (right side of FIG. 3(a)) of the controller unit 20 so that the controller unit side connector 25 contacts with the holder side connector 35 when the controller unit 20 positioned at the holding position. Accordingly, the electric power of the electric power source 45 is supplied to the electrical power supply line 61 of the controller unit 20 via the electric cable line 38, the holder side connector 35 and the controller unit side connector 25.

In the case the controller unit 20 is removed from the holder 30 (the controller unit 20 is not positioned at the holding position), the controlling unit side connecter 25 disengages from the holder side connector 35 so that the electric power from the electrical power source 45 is not supplied to the electrical power supply line 61 and supply source of the electric power is switched from the electrical power source 45 to the internal battery 65.

Figure 4:
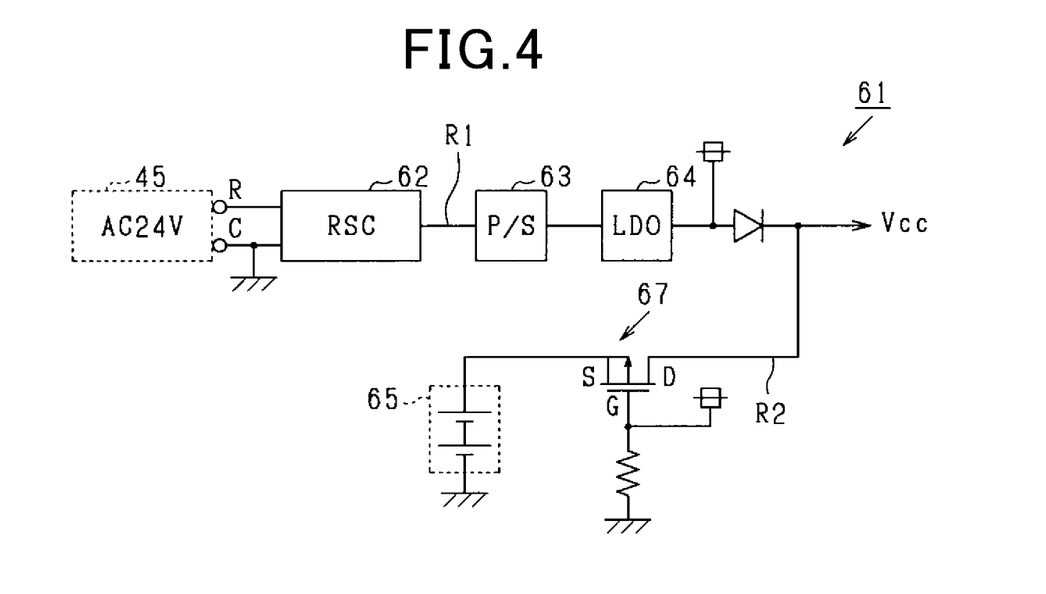
FIG. 4 shows an electrical power supply line.

As shown in FIG. 4, the electrical power supply line 61 of the controller unit 20 has a first supply line R1 through which the electric power from the electrical power source 45 is supplied to the CPU 51 and other elements of the controller unit 20 and a second supply line R2 through which the electric power from the internal battery 65 is supplied to the CPU 51 and other elements.

A rectify smoothing circuit 62 by which the electric power from the electrical power source 45 is converted from alternate current to direct current, a power supply 63 by which the direct current converted by the rectify smoothing circuit 62 is stabilized, and a low drop out regulator 64 by which the electric power form the low drop out regulator 64 is decreased down to a predetermined electric voltage are positioned in the first supply line R1. Accordingly, the predetermined electric voltage is supplied to the CPU 51 and other elements of the controller unit 20.

As to the present disclosure, the predetermined electric voltage is 3V so that the electric voltage supplied from the first supply line R1 is coincident with the electric voltage of the internal battery 65.

A P type (positive type) MOSFET (metal-oxide-semiconductor field-effect transistor) 67 is positioned in the second supply line R2 in such a manner that a source of which is connected with the internal battery 65, a drain of which is connected to the output line for the CPU 51 and other elements, and a gate of which is connected to the down side of the regulator 64. The predetermined electric voltage from the regulator 64 is applied to the gate of the P type MOSFET 67 in the case the electric power from the electrical power source 45 is supplied. The P type MOSFET 67 of the present disclosure works as a "switch" and/or a "first switch".

Figure 6A:
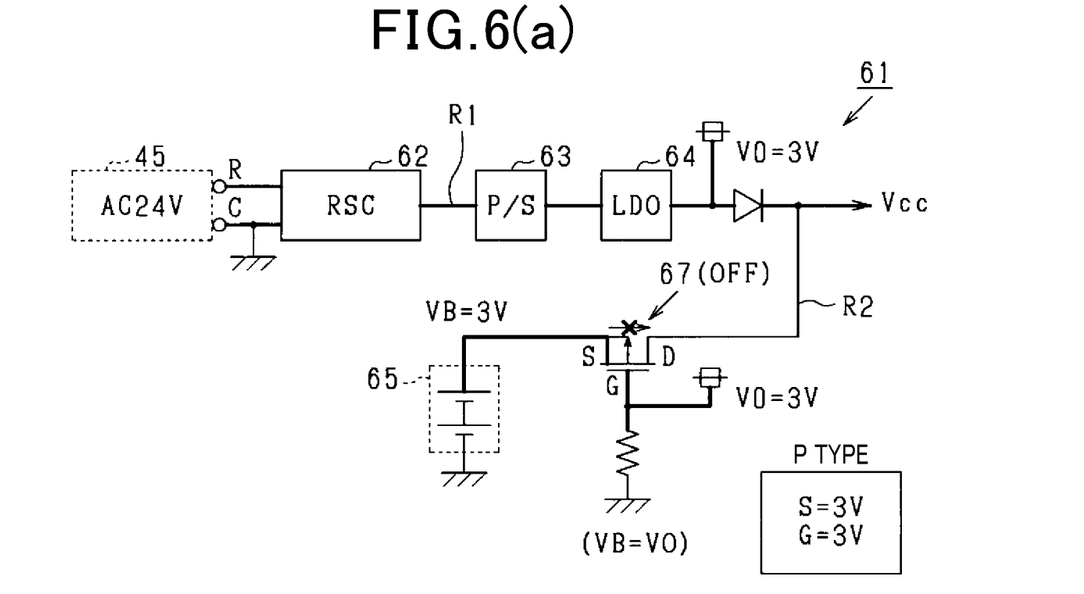
FIG. 6(a) shows the electrical power supply line while a first switch is off.
Figure 6B:
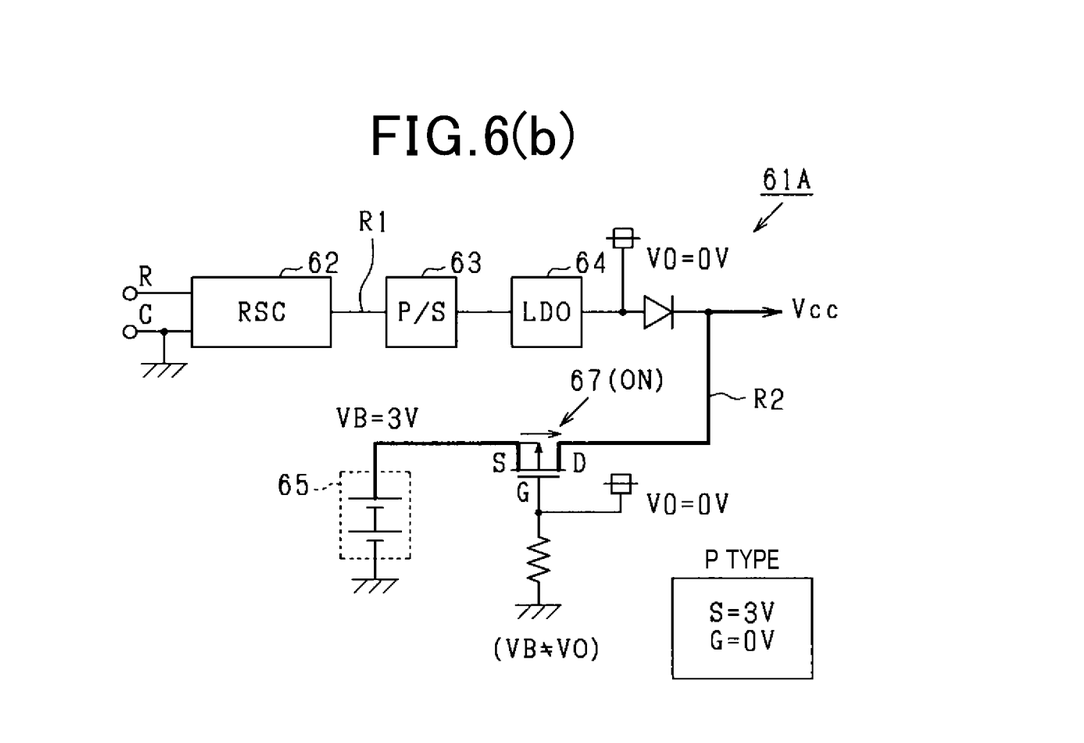

FIG. 6(a) shows the electrical power supply line 61 while the electric power from the electrical power source 45 is supplied to the controller unit 20, namely controller unit 20 is positioned at the holding position in the holder 30. FIG. 6(b) shows the electrical power supply line 61 while the electric power from the electrical power source 45 is not supplied to the controller unit 20, namely controller unit 20 is positioned outside of the holding position.

As shown in FIG. 6(b), the electric power supply from the electrical power source 45 is stopped when the controller unit 20 is removed from the holder 30 so that the electric power supply through the first supply line R1 is stopped and that the electric voltage applying to the gate of the P type MOSFET 67 downs to zero "0". As the electric voltage of 3V from the internal battery 65 is always applied to the source of the MOFSET 67 regardless with the electric power from the electrical power source 45, negative electric voltage is applied to the gate compare to the electric voltage applied to the source of the MOSFET 67.

Since the electric power (3V) from the internal battery 65 applies to the source of MOSFET 67, and since no electric power (0V) is applied to the gate while the electrical power source 45 does not supply the electric power, the electric voltage difference between the source and the gate of the MOSFET 67 is higher than a predetermined threshold level voltage such as 2V. Accordingly, the electric current flows between the source and the drain of the MOSFET 67 (a permitting position of the MOSFET 67) so that the electric power of the internal battery 65 is supplied to the CPU 51 and other elements.

On the other hand, as shown in FIG. 6(a), the electrical power source 45 supplies the electric power to the controller unit 20 when controller unit 20 is held in the holder 30 so that the electric power of the electrical power source 45 is supplied to the CPU 51 and other elements.

At this moment, the predetermined voltage such as 3V is applied to the gate of the MOSFET 67 via the regulator 64 so that the electric voltage applied to the gate becomes equal to that of the source of the MOSFET 67. Accordingly, the electric current does not flow between the source and the drain of the MOSFET 67 (a limiting position of the MOSFET 67) so that the electric power of the internal battery 65 is not supplied to the CPU 51 and other elements.

The above described first disclosure has following effects. As the controller unit 20 is a potable type, the operator could carry the controller unit 20. In the case if the electric power supplying to the controller unit 20 is limited only from the internal battery 65, the discharge of the internal battery 65 may decrease the convenience of the operator. The controller unit 20 of the first disclosure uses the electric power from the electrical power source 45 while the controller unit 20 is held in the holder 30. The electric power of the internal battery 65 of the first disclosure is only consumed while the controller unit 20 is removed from the holder 30. Accordingly, the possibility of the shortage of the electric power of the internal battery 65 is effectively decreased. Even in such case of the shortage of the electric power of the internal battery 65, the operator could operate the controller unit 20 by holding the same in the holder 30.

As the MOSFET 67 of the first disclosure located between the internal battery and the output to the CPU and other element switches between the permitting position and the limiting position in accordance with the electric power supplied from the electrical power source 45, the electrical supply line 61 is automatically switched between the electrical power source 45 and the internal battery 65 without additional switching operation of the operator.

As the P type MOSFET 67 is used as a switch and as the regulator 54 so regulates the electric voltage that the electric voltage is decreased down to the predetermined voltage, the above explained switching operation is effectively achieved.

Figure 5:
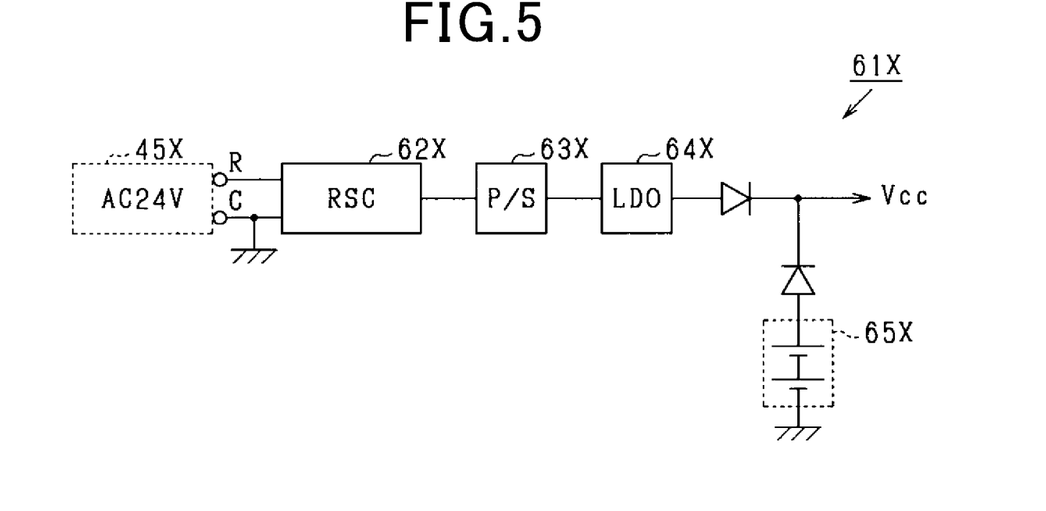
FIG. 5 shows a comparative example of an electrical power supply line.

As shown in FIG. 5, a comparing example having a diode between the internal battery 65X and the output line to the CPU 51 and other elements may achieve the switching operation in a simple electric power supply line. However, since the diode causes a voltage drop due to a forward voltage (VF), the shortage of the electric power for the CPU 51 and the other element may be occurred. Especially, as the VF is varied in accordance with the room temperature, the possibility of such shortage could not be neglect. In order to avoid such shortage, the number of AA cell of the internal battery 65X may be increased more than three (3). However, such case to use many AA cell of the internal battery 65X makes the air conditioning controller 12 heavier as well as makes the electric current leak more than the permissible charging electric current. Accordingly, the electrical power supply line 61 using the MOSFET 67 of the present disclosure has more liability than the comparing example shown in FIG. 5.

Second Embodiment

The second disclosure is different form the first disclosure at the electrical supply line 61 so that the second disclosure is mainly explained about the electrical supply line 61 hereinafter.

Figure 7:
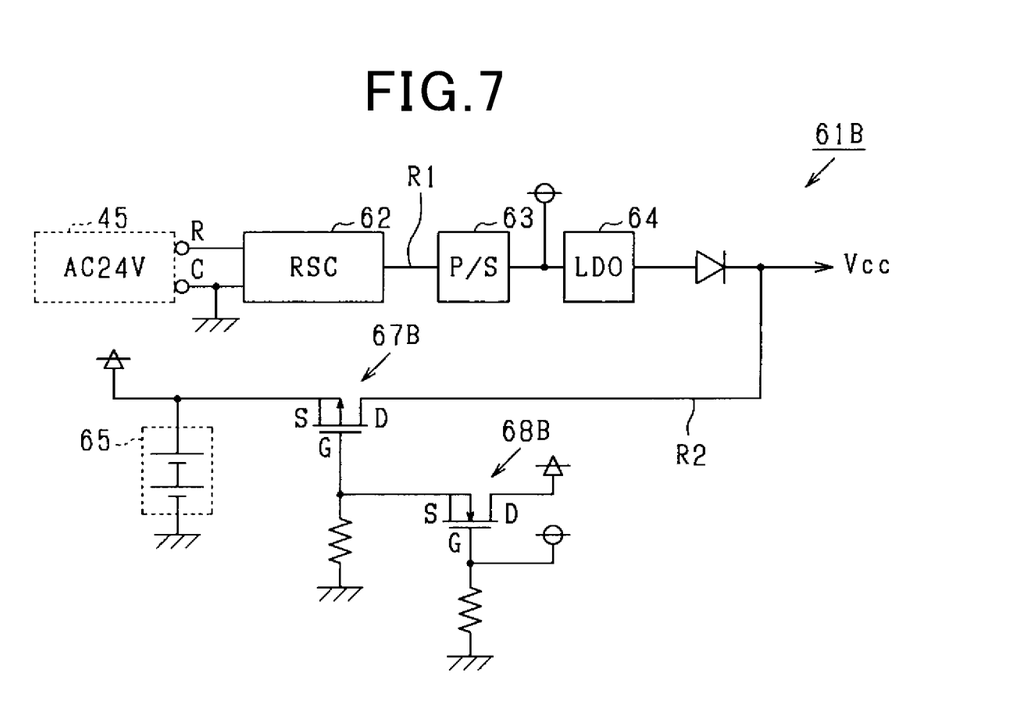
FIG. 7 shows the electrical power supply line of a second disclosure.

As shown in FIG. 7, the electrical supply line 61 of the second embodiment has a P type (positive type) MOSFET 67B located between the internal battery 65 and the output line and the gate of MOSFET 67B is grounded via a pull-down resistance same as the first embodiment. The second embodiment additionally has a N type (negative type) MOSFET 68B located between the pull-down resistance and the gate of MOSFET 67B working as a switch switching between a permitting position and a limiting position.

A source of the MOSFET 68B is connected between the gate and the pull-down resistance of the MOSFET 67B. A drain of the MOSFET 68B is connected with the internal battery 65 so that the electric power (3V) from the internal battery 65 is always applied to the drain of the MOSFET 68B regardless of the electric power of the electrical power source 45.

A gate of MOSFET 68B is conncter to the first supply line R1 between the power supply 63 and the regulator 64, so that the electric voltage not regulated by the regulator 64 (24V for example) is applied to the gate of the MOSFET 68B when the electric power from the electrical power source 45 is supplied. The P type MOSFET 67B of the second embodiment works as a "first switch" and the N type MOSFET 68B works as a "second switch".

Figure 8A:
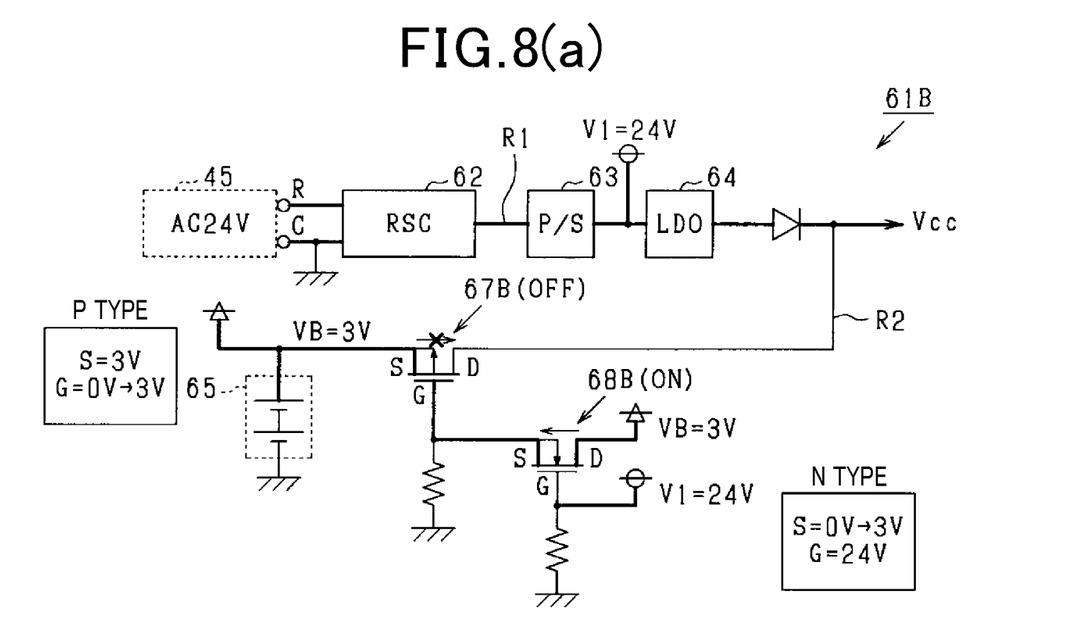
FIG. 8(a) shows the electrical power supply line while the first switch is off.
Figure 8B:
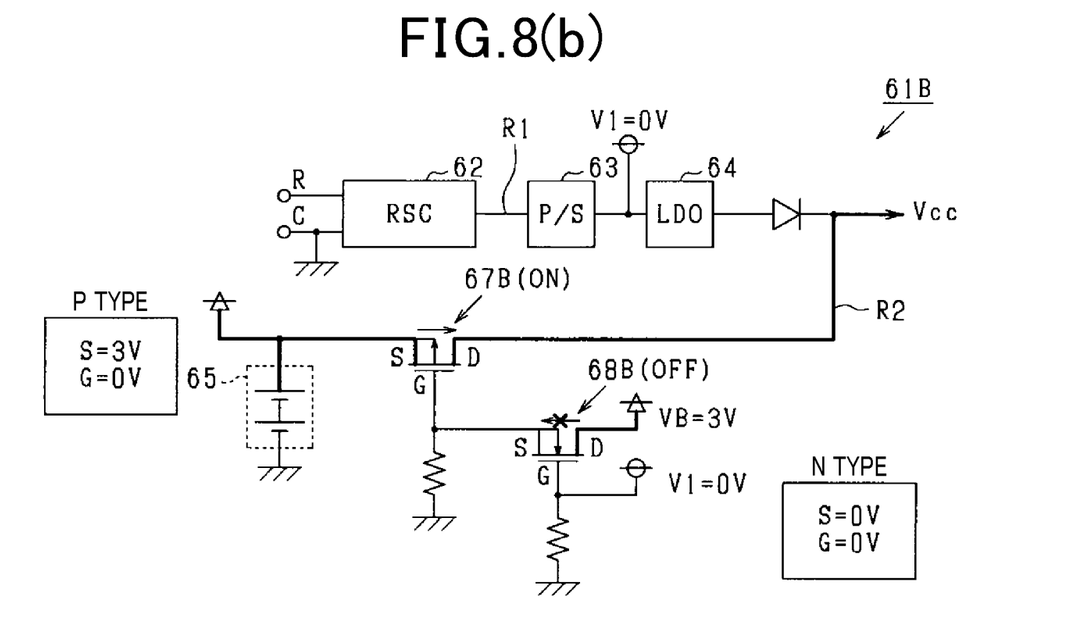

The switching operation of the electrical power supply line 61B is explained hereinafter by using FIGS. 8(*a*) and 8(*b*). FIG. 8(*a*) shows the condition that the electric power of the electrical power source 45 is supplied (the controller unit 20 is held in the holder 30) and FIG. 8(*b*) shows the condition that the electric power of the electrical power source 45 is not supplied (the controller unit 20 is moved out from the holder 30).

As shown in FIG. 8(*b*), the electric power is not supplied through the first supply line R1 and the electric voltage applying to the gate of the MOSFET 68B downs to zero "0" while the controller unit 20 is moved out from the holder 30. As the electric voltage of the source of the MOSFET 68B is zero "0" at this moment, the voltage of the source of the MOSFET 68B is the same as that of the gate of the MOSFET 68B. Namely, the voltage difference between the source and the gate of the MOSFET 68B is smaller than the predetermined threshold level at this moment. So that the electric current does not flow between the source and the gate (limiting position of MOSFET 68B) and the electric power from the internal battery 65 is not applied to the gate of the MOSFET 67B.

Since the electric power (3V) of the internal battery 65 is applied to the source of the MOSFET 67B and no electric power (0V) is applied to the MOSFET 67B, the voltage difference between the source and the gate of the MOSFET 67B is higher than the predetermined threshold level voltage (2V for example). Accordingly, the electric current flows between the source and the drain (permitting position of MOSFET 67) and the electric power of the internal battery 65 is supplied to the CPU 51 and the other elements.

On the other hand, as shown in FIG. 8(*a*), the electric power of the electrical power source 45 is supplied to the controller unit 20 when the controller unit 20 is held in the holder 30. At this condition, the electric power of the electrical power source 45 is supplied to the CPU 51 and the other elements and the electric voltage applied to the gate of the MOSFET 68B is 24V. As no electric power (0V) is applied to the source of the MOSFET 68B and the electric power (24V) of the electrical power source is applied to the gate of the MOSFET 68B, the voltage difference between the source and the gate of the MOSFET 68B becomes higher than the predetermined threshold level voltage. Accordingly, the electric current flows between the source and the drain (permitting position of the MOSFET 68B) so that the electric power (3V) of the internal battery 65 is applied to the gate of the MOSFET 687 via the drain and the gate of the MOSFET 68B. As the condition that the electric power (24V) applying to the gate of the MOSFET 68B is higher than the electric power (3V) applying to the source of the MOSFET 68B is maintained at this moment so that the voltage difference between the source and the gate of the MOSFET 68B is continuing to be higher than the predetermined threshold level voltage.

Since the electric power (3V) of the internal battery 65 is applied to the source of the MOSFET 67B, the electric power (3V) of the source becomes to be the same electric power (3V) of the gate of the MOSFET 67B. So that the difference of the electric voltage between the source and the gate of the MOSFET 67B becomes to be lower than the predetermined threshold level voltage (2V for example), that the electric current does not flow between the source and the drain (limiting position of the MOSFET 67B), and that the electric power of the internal battery 65 is not supplied to the CPU 51 and the other elements.

The electric voltage may be reduced due to the usage and/or the room temperature. However, as the electric power of the internal battery 65 is applied to both of the source and the gate of MOSFET 67B, the voltage difference between the source and the gate due to the voltage reduction of the internal battery 65 is effectively avoided. Namely, since the N type MOSFET 68B of the second embodiment is switched due to the electric power of the electrical power source 45 and since the P type MUSFET 67B of the second embodiment is switched the electric power (electric power from the internal battery 65) applying to the gate due to the MOSFET 68B, the effect due to the voltage reduction of the internal battery 65 could be minimized and therefore the liability of the switching operation of the electrical power supply line 61B could be increased.

Especially, since the electric power applied to the gate of the N type MOSFET 68B could be substantially higher than that applied to the source, the liability of the switching operation of the electrical power supply line is effectively increased.

Other Modifications

The present disclosure may be modified as follows. The following modifications could be connected each other.

The other type of the switching element such as a bipolar transistor than the MOSFET is used for switching the electrical power supply line 61.

The reset button by which the operator resets the touch IC 54 could be made on the controller unit 20.

The holder side connector 35 and the unit side connector 25 of the above described embodiment is connected and disconnected in accordance with the position of the controller unit 20. However, the holder side connector 35 and the unit side connector 25 may be switched between the connecting position and disconnecting position by the operator while the controller unit 20 is stayed in the holder 30.

The air conditioning controller 12 of the above described embodiment is a portable, but could be fixed. The other type such as a resistance membrane type, an optical type or an ultrahigh sonic surface elasticity wave type touch panel 55 could be used than the electrostatic capacitance type touch panel 55.

The other type such as rechargeable internal battery 65 may be used than the AA cell type internal battery 65.

Though 24V of the electrical power source 45 is applied on the gate of the N type MOSFET 68B of the second embodiment, the electric voltage applied on the gate may be less than 24V as long as the MOSFET 68B is switched between the permitting position and the limiting position.

What is claimed is:

1. An air conditioning controller for controlling an air conditioner by an operation of an operator, comprising;
a controller unit having an operating part by which the operator operates the air conditioner;
a holder holding the controller unit at a predetermined position; and
an electrical switch for switching an electrical power supply line between a first position that the controller unit positions outside of the holder and that the electric power from an internal battery is supplied to a controlling part of the controller unit and a second position that the controller unit positions in the holder and that the electric power from an electrical power source is supplied to the controlling part of the controller unit, wherein the electrical switch switches between the first position where the electric power from the electrical power source is not supplied to the controller unit and the electric power from the internal battery is supplied to the controller unit and the second position where the electric power from the electrical power source is supplied to the controller unit and the electrical power from the internal battery is not supplied.

2. The air conditioning controller of claim 1,
the electrical switch switches from the second position to the first position when the controller unit is moved from the holder and the electric power from the electrical power source is not supplied.

3. The air conditioning controller of claim 1,
the electrical switch switches from the first position to the second position when the controller unit is moved in the holder and the electric power from the electrical power source is supplied.

4. The air conditioning controller of claim 1,
the holder has a holder side connector connecting with the electric power source, and
the controller unit has a controller unit side connecter which is connectable to the holder side connecter, wherein
the holder side connecter contacts with the controller unit side connecter when the controller unit is positioned in the holder and the holder side connecter disconnects with the controller unit side connecter when the controller unit positions outside of the holder.

5. The air conditioning controller of claim 1,
the electrical switch has a P type MOSFET switch a source of which is connected with the internal battery, a drain of which is connected with the controlling part and a gate of which is connected with the electrical power source, wherein
the electrical switch switches between the first position the electric power from the electrical power supply is not supplied and an electric voltage difference between the source and the gate is more than a predetermined threshold level voltage and the second position the electric power from the electrical power source is supplied and the electric voltage difference between the source and the gate is smaller than the predetermined threshold level voltage.

6. The air conditioning controller of claim 5,
the electric voltage of the internal battery is lower than the electric voltage of the electrical power source, and
the electrical switch has a regulator so regulating the voltage applying to the gate that the electric voltage difference between the gate and the source is lower than the predetermined threshold level voltage when the electric power source supplies the electric power to the controller unit.

7. The air conditioning controller of claim 1,
the electrical switch has a P type MOSFET first switch and a gate of which is controlled by an N type MOSFET second switch, wherein
a source of the P type MOSFET first switch is connected with the internal battery, a drain of the P type MOSFET first switch is connected with the controlling part, and the gate of the P type MOSFET first switch is connected with the internal battery via the N type MOSFET second switch, wherein
the P type MOSFET first switch switches between the first position where an electric voltage difference between the source and the gate of the P type MOSFET first switch is higher than a first predetermined threshold level voltage and the second position where the electric voltage difference between the source and the gate of the P type MOSFET first switch is lower than the first predetermined threshold level voltage, and wherein the N type MOSFET second switch controls the P type MOSFET first switch between a third position where an electric voltage applying from the internal battery to the gate of the P type MOSFET first switch is so regulated that the electric voltage difference between the source and the gate of the P type MOSFET first switch is lower than the first predetermined threshold level voltage when the electric power is supplied from the electrical power source to the controller unit and a fourth position where the electric voltage from the internal battery is not supplied to the gate of the P type MOSFET first switch so that the electric voltage difference between the source and the gate of the P type MOSFET first switch is higher than the first predetermined threshold level voltage when the electric power is not supplied from the electrical power source to the controller unit.

8. The air conditioning controller of claim 7, wherein the gate of the N type MOSFET second switch is connected to the electrical power source when the electrical power source supplies the electric power to the controller unit, the drain of the N type MOSFET second switch is connected with the internal battery, and the source of the N type MOSFET second switch is connected with the gate of the P type MOSFET first switch, and wherein the N type MOSFET second switch switches between the third position where the electric voltage difference between the source and the gate of the N type MOSFET second switch is higher than a second predetermined threshold level voltage when the electric power is supplied from the electrical power source to the controller unit so that the electric power from the internal battery is applied to the gate of the P type MOSFET first switch and that the P type MOSFET first switch turns to the second position and the fourth position where the electric voltage difference between the source and the gate of the N type MOSFET second switch is lower than the second predetermined threshold level voltage when the electric power is not supplied from the electrical power source to the controller unit so that the electric power from the internal battery is not applied to the gate of the P type MOSFET first switch and that the P type MOSFET first switch turns to the first position.

9. The air conditioning controller of claim 8, wherein the electric voltage applied to the gate of the N type MOSFET second switch is varied between the third position and the fourth position, and wherein the electric voltage difference between the gate and the source of said the N type MOSFET second switch is higher than the second predetermined threshold level voltage on both positions of the third position and the fourth position.

10. An air conditioner comprising:
the air conditioning controller of claim 1, wherein
the air conditioner is operated by a commanding order from the air conditioning controller.

11. An air conditioning controller for controlling an air conditioner by an operation of an operator, comprising;
a controller unit having an operating part by which the operator operates the air conditioner and a controlling part outputting a commanding order provided by the operating part to the air conditioner, and an electrical switch for switching an electrical power supply line between a first position that the electric power from an internal battery is supplied to the controlling part of the controller unit and a second position that the electric power from an electrical power source is supplied to the controlling part of the controller unit, wherein the electrical switch has a P type MOSFET first switch located between the internal battery and the controlling part a source of which is connected with the internal battery, a drain of which is connected with the controlling part and a gate of which is controlled by an N type MOSFET second switch, wherein a source of the N type MOSFET second switch is connected with the gate of the P type MOSFET first switch, a drain of the N type MOSFET second switch is connected with the internal battery and a gate of the N type MOSFET second switch is connected with the electrical power source when the electrical power source supplies the electric power to the controller unit, wherein the P type MOSFET first switch switches between a permitting position where an electric flow between the source and the drain of the P type MOSFET first switch is permitted when an electric voltage difference between the source and the gate of the P type MOSFET first switch is higher than a first predetermined threshold level voltage and a limiting position where the electric flow between the source and the drain of the P type MOSFET first switch is limited when the electric voltage difference between the source and the gate of the P type MOSFET first switch is lower than the first predetermined threshold level voltage, wherein the N type MOSFET second switch switches between a permitting position where electric flow between the source and the drain of the N type MOSFET second switch is permitted when an electric voltage difference between the source and the gate of the N type MOSFET second switch is higher than a second predetermined threshold level voltage and a limiting position where the electric flow between the source and the drain of the N type MOSFET second switch is limited when the electric voltage difference between the source and the gate of the N type MOSFET second switch is lower than the second predetermined threshold level voltage, and wherein the P type MOSFET first switch turns to the limiting position where the electric power from the internal battery is applied to the gate of the P type MOSFET first switch when the N type MOSFET second switch turns to the permitting position where the electric power from the electrical power source is applied to the gate of the N type MOSFET second switch when the electrical power source supplies the electric power to the controller unit and the P type MOSFET first switch turns to the permitting position where the electric power from the internal battery is not applied to the gate of the P type MOSFET first switch when the N type MOSFET second switch turns to the limiting position where the electric power from the electrical power source is not applied to the gate of the N type MOSFET second switch when the electrical power source does not supply the electric power to the controller unit.

* * * * *